United States Patent
Demos et al.

(10) Patent No.: US 7,588,803 B2
(45) Date of Patent: Sep. 15, 2009

(54) MULTI STEP EBEAM PROCESS FOR MODIFYING DIELECTRIC MATERIALS

(75) Inventors: Alexandros T. Demos, Fremont, CA (US); Li-Qun Xia, Santa Clara, CA (US); Tzu-Fang Huang, San Jose, CA (US); Wen H. Zhu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 432 days.

(21) Appl. No.: 11/047,785

(22) Filed: Feb. 1, 2005

(65) Prior Publication Data
US 2006/0171653 A1     Aug. 3, 2006

(51) Int. Cl.
    *B05D 3/06*       (2006.01)
    *C08J 7/18*       (2006.01)
    *C23C 14/30*      (2006.01)
    *G21G 1/10*       (2006.01)
    *H01L 21/00*      (2006.01)

(52) U.S. Cl. .................. 427/551; 427/552; 427/595; 427/596; 427/597; 250/492.1; 250/492.23; 250/492.3; 438/795; 438/796; 438/797; 438/798

(58) Field of Classification Search ......... 427/551–552, 427/595–597; 250/492.1–492.3; 438/795–798
See application file for complete search history.

(56) References Cited

U.S. PATENT DOCUMENTS

| | | | |
|---|---|---|---|
| 5,003,178 A | | 3/1991 | Livesay |
| 5,468,595 A | * | 11/1995 | Livesay ........................ 430/296 |
| 6,080,526 A | * | 6/2000 | Yang et al. ................... 430/296 |
| 6,132,814 A | | 10/2000 | Livesay et al. |
| 6,251,806 B1 | * | 6/2001 | Chang et al. ................. 438/782 |
| 6,582,777 B1 | * | 6/2003 | Ross et al. .................... 427/551 |
| 6,607,991 B1 | | 8/2003 | Livesay et al. |
| 6,693,050 B1 | | 2/2004 | Cui et al. |
| 6,878,644 B2 | * | 4/2005 | Cui et al. ...................... 438/782 |

FOREIGN PATENT DOCUMENTS

JP        62037930 A   *   2/1987

\* cited by examiner

*Primary Examiner*—Timothy H Meeks
*Assistant Examiner*—Cachet I Sellman
(74) *Attorney, Agent, or Firm*—Townsend and Townsend and Crew LLP

(57) ABSTRACT

According to one embodiment of the invention, a method of modifying a mechanical, physical and/or electrical property of a dielectric layer comprises exposing the dielectric layer to a first dose of electron beam radiation at a first energy level; and thereafter, exposing the dielectric layer to a second dose of electron beam radiation at a second energy level that is different from the first energy level.

12 Claims, 3 Drawing Sheets

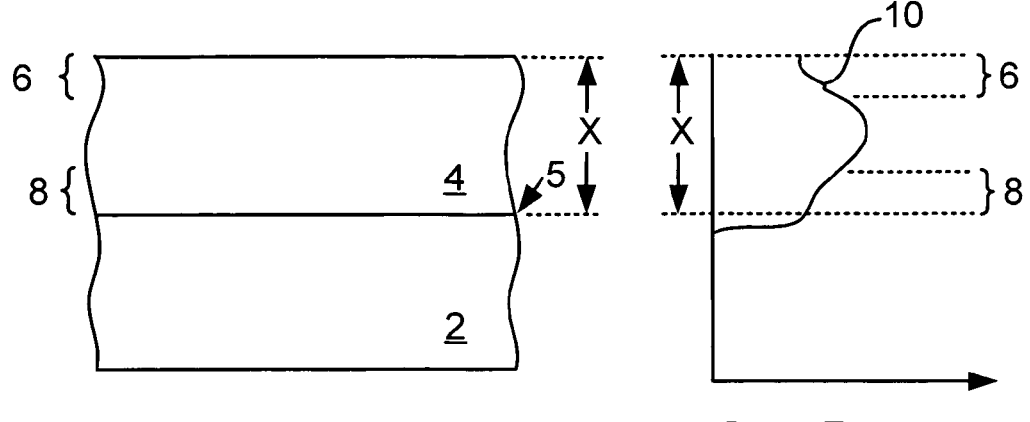
FIG. 1(a)   FIG. 1(b)
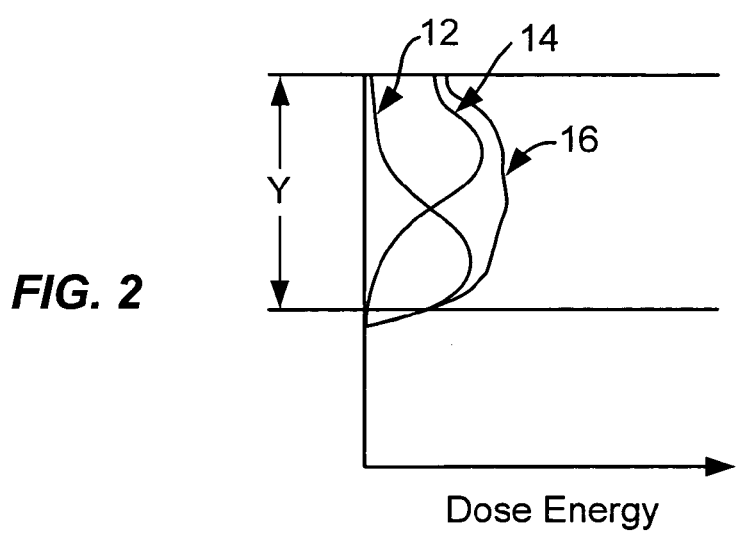
FIG. 2
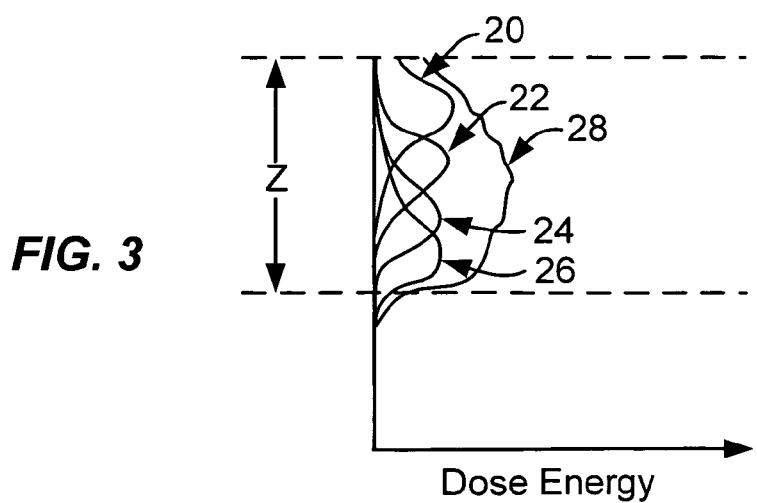
FIG. 3

MULTI STEP EBEAM PROCESS FOR MODIFYING DIELECTRIC MATERIALS

BACKGROUND OF THE INVENTION

One of the primary steps in the fabrication of modern semiconductor devices is the formation of a thin film on a semiconductor substrate by chemical reaction of gases. Such a deposition process is referred to generally as chemical vapor deposition ("CVD"). Conventional thermal CVD processes supply reactive gases to the substrate surface, where heat-induced chemical reactions take place to produce a desired film. Plasma enhanced CVD techniques, on the other hand, promote excitation and/or dissociation of the reactant gases by the application of radio frequency (RF) or microwave energy. The high reactivity of the released species reduces the energy required for a chemical reaction to take place, and thus lowers the required temperature for such plasma processes.

As semiconductor device sizes have become smaller and integration density increases, many issues have become of increasing concern to semiconductor manufacturers. One such issue is that of interlevel "crosstalk." Crosstalk is the undesired coupling of an electrical signal on one metal layer onto another metal layer, and arises when two or more layers of metal with intervening insulating or dielectric layers are formed on a substrate. Crosstalk can be *reduced by moving the metal layers further apart, minimizing the areas of overlapping metal between metal layers, reducing the dielectric constant of the material between metal layers and combinations of these and other methods. Undesired coupling of electrical signals can also occur between adjacent conductive traces, or lines, within a conductive layer. As device geometries shrink, the conductive lines become closer together and it becomes more important to better isolate them from each other.

Another such issue is the "RC time constant" of a particular trace. Each conductive trace has a resistance, R, that is a product of its cross section and bulk resistivity, among other factors, and a capacitance, C, that is a product of the surface area of the trace and the dielectric constant of the material or the space surrounding the trace, among other factors. If a voltage is applied to one end of the conductive trace, charge does not immediately build up on the trace because of the RC time constant. Similarly, if a voltage is removed from a trace, the trace does not immediately drain to zero. Thus high RC time constants can slow down the operation of a circuit. Unfortunately, shrinking circuit geometries produce narrower traces, which results in higher resistivity. Therefore it is important to reduce the capacitance of the trace, such as by reducing the dielectric constant of the surrounding material between traces, to maintain or reduce the RC time constant.

In order to further reduce the size of devices on integrated circuits, it has become necessary to use insulators that have a lower dielectric constant than the insulators of previous generations of integrated circuits. To this end, semiconductor manufacturers, materials suppliers and research organizations among others have been researching and developing materials for use as intermetal dielectric (IMD) layers in integrated circuits that have a dielectric constant (k) below that of undoped silicon oxide (USG, generally between about 3.9-4.2) and below that of fluorine-doped silicate glass (FSG, generally between about 3.4-3.7).

One such insulating material comprises silicon, oxygen and carbon and is sometimes referred to as a carbon-doped silica glass or an SiOC film. A variety of different well-known techniques can be used to deposit carbon-doped silica glass insulation layers on a substrate. Such techniques include both thermal and plasma-enhanced CVD techniques. For example, one method of forming a carbon-doped silica glass film forms a plasma from a process gas comprising an oxygen-containing organosilicon compound, such as octamethylcyclotetrasiloxane (OMCTS), a carrier gas, such as helium, and another oxygen source, such as molecular oxygen.

Another exemplary method of forming a carbon-doped silica glass film forms a plasma from a process gas comprising an oxygen-free organosilicon compound, such as trimethylsilane (TMS), a carrier gas, such as helium, and an oxygen source, such as molecular oxygen. Still another method of forming a carbon-doped silica glass film forms gas phase reactions at the surface of a substrate by reacting an organosiline precursor having at least one Si—C bond, such as trimethylsilane (TMS) with ozone within a subatmospheric pressure range (e.g., between 50 Torr and below about 450 Torr) and a relatively low temperature (e.g., below 250° C.). Such methods may also employ a inert gas flow, such as a flow of helium, to stabilize the process and improve deposition uniformity.

After a carbon-doped silica glass film is formed on a substrate, it is sometimes useful to improve the mechanical, physical and/or electrical properties of the initially deposited film. One method of doing such is to subject the deposited film to a thermal cure or anneal step. There is a trend in the semiconductor industry, however, to reduce the total thermal budget that a particular wafer is exposed to during all the various steps associated with forming integrated circuits on the wafer. Reducing the overall thermal budget may include reducing either or both the peak process temperature of any given step and/or the total process time the substrate is heated at temperature.

One technique that has been developed to modify the mechanical, physical and/or electrical properties of carbon-coped silica glass films includes exposing the films to a beam of electrons as described in U.S. Pat. No. 6,582,777 assigned to Applied Materials, the assignee of the present invention.

While the electron beam modification technique described in the U.S. Pat. No. 6,582,777 is highly beneficial for a variety of applications, improved or alternative techniques for modifying the mechanical, physical and/or electrical properties of carbon-doped silica glass films are continuously being sought.

BRIEF SUMMARY OF THE INVENTION

Embodiments of the invention pertain to a multi-step electron beam treatment technique in which the energy level of the beam is changed between steps in order in order to provide a more uniform exposure throughout the depth of the dielectric layer. Embodiments of the invention are particularly useful modifying the mechanical, physical and/or electrical properties of carbon-doped silica glass films but can also be used to modify other types of dielectric materials. Also, while embodiments of the invention may be beneficially used to modify properties of dielectric films of any thickness, they are particularly useful in modifying properties of relatively thick dielectric films, for example dielectric films having a thickness of greater than 5,000 Angstroms.

According to one embodiment of the invention, a method of modifying a mechanical, physical and/or electrical property of a dielectric layer comprises exposing the dielectric layer to a first dose of electron beam radiation at a first energy level; and thereafter, exposing the dielectric layer to a second dose of electron beam radiation at a second energy level that is different from the first energy level. In some particular embodiments the energy level is increased or decreased at least 20% or at least 50% between successive exposure steps. And in other embodiments the energy level is increased by a multiple of the initial exposure (or decreased by a multiple of the final exposure) where the multiple is at least 0.5 in some instances and at least either 0.8 or 1.0 in other instances.

According to another embodiment of the invention, a method of forming a carbon-doped silica glass layer on a substrate is provided that comprises depositing the carbon-doped silica glass layer using a chemical vapor deposition technique; exposing the carbon-doped silica glass layer to a first dose of electron beam radiation at a first energy level; and thereafter, exposing the carbon-doped silica glass layer to a second dose of electron beam radiation at a second energy level that is different from the first energy level.

These and other embodiments of the present invention, as well its advantages and features, are described in more detail in conjunction with the description below and attached figures.

BRIEF DESCRIPTION OF THE DRAWINGS

FIG. 1(b) is a simplified graph depicting the distribution of electron energy within the dielectric layer depicted in FIG. 1(a) according to a previously known electron beam treatment process;

FIG. 2 is a simplified graph depicting the distribution of electron energy within a dielectric layer according to an embodiment of the present invention;

FIG. 3 is a simplified graph depicting the distribution of electron energy within a dielectric layer according to another embodiment of the present invention;

DETAILED DESCRIPTION OF THE INVENTION

Figure 4:
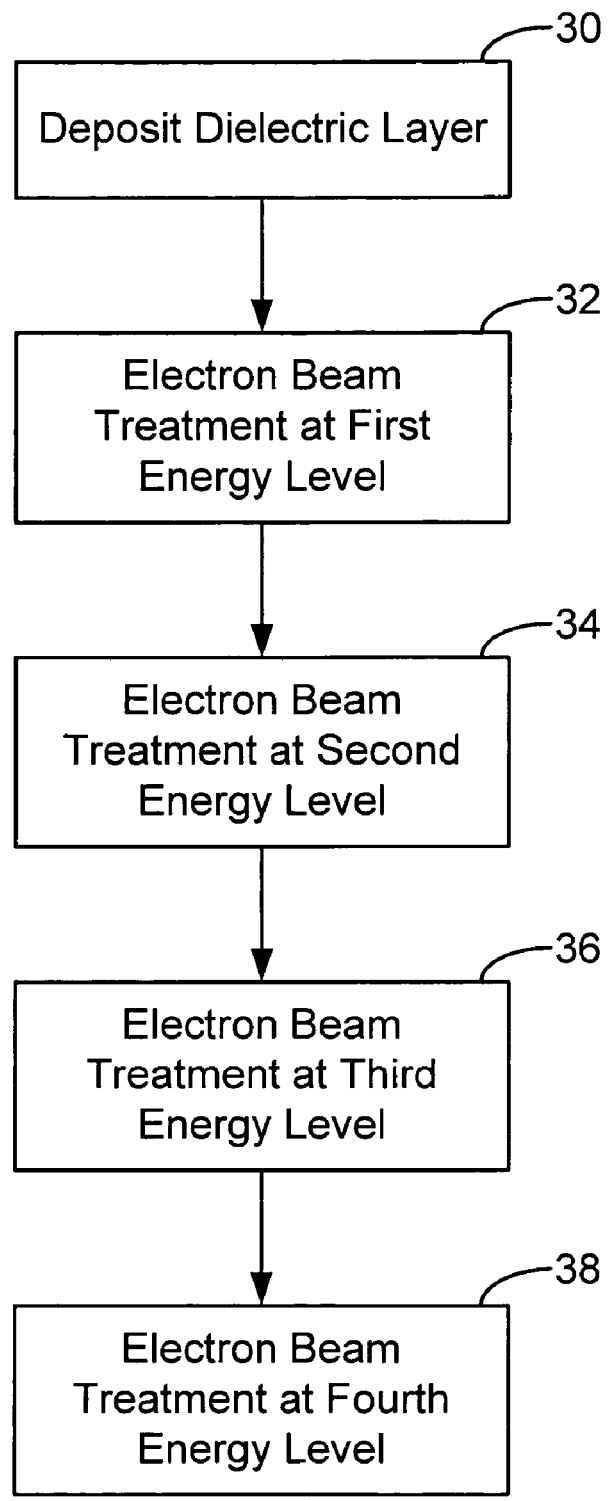
FIG. 4 is a flowchart depicting the steps associated with one embodiment of the present invention.

As explained above, electron beams have been used to successfully modify the mechanical, physical and/or electrical properties of a variety of dielectric layers. In performing such property modification processes, it is sometimes important to adequately modify the entire thickness of the dielectric layer. This can be done by selecting an appropriate energy and dose level for the electron beam treatment step to ensure that a sufficient number of electrons penetrate the entire thickness of the film.

FIG. 1(a) is a simplified cross-sectional view of a substrate 2 having a dielectric layer 4 deposited thereon and FIG. 1(b) is a simplified graph depicting the distribution of electron energy within a dielectric layer 4 according to a previously known electron beam treatment process. As shown in FIGS. 1(a) and (b), dielectric layer 4 has a thickness of X and is deposited over substrate 2 that may include, for example, underlying features (not shown) formed underneath the dielectric layer. FIG. 1(b) graphically depicts the electron energy level distributed throughout the entire thickness of dielectric layer 4 (graph line 10) for a previously known electron beam treatment step that employs an energy level and dose selected to ensure an adequate number of electrons reach the lower portion of dielectric layer 4 down to the interface 5 between layer 4 and underlying substrate 2.

As shown in FIG. 1(b), the distribution of electron energy in layer 4 has a Gaussian profile (graph line 10). Thus, in order to achieve adequate electron energy in both an upper strata 6 and lower strata 8 of layer 4, excess electron energy is delivered to the middle of the film.

The inventors have identified several issues of concern with such an energy distribution. First, the nonuniform nature of the distributed energy may result in nonuniform properties of dielectric layer 4 throughout the thickness of the layer. For example, the mechanical, physical and/or electrical properties of the lower and/or upper strata 6 and 8 of layer 4 may differ in some undesirable way from the corresponding properties of the center strata of layer 4. Second, the formation of the electron beam used to treat layer 4 may require applying a voltage between an appropriately spaced cathode and anode pair. The cathode in an electron beam formation chamber may be a conductive material that is prone to some level of sputtering, which in turn may introduce unwanted contaminants into the dielectric layer. For example, if the cathode is made from aluminum material, some amount of sputtered aluminum may become incorporated into layer 4.

The inventors have developed a multistep electron beam treatment step in order to solve these problems. Reference is now made to FIG. 2, which is a simplified graph depicting the distribution of electron energy within a dielectric layer (represented by thickness Y) according to one embodiment of the present invention. The dielectric layer shown in FIG. 2 is exposed to two electron beam treatment steps (graph lines 12 and 14, respectively) rather than just a single step. The energy and dose level of each of the two steps is selected to improve the uniformity of electron energy distributed throughout the depth of the layer. Thus, for example, one of the doses is delivered at an energy level selected to have a Gaussian distribution centered at about one-third of the depth of the dielectric layer (line 12) while the second dose is delivered at an energy level selected to have a Gaussian distribution centered at about two-thirds the depth of the dielectric layer (line 14). As shown in FIG. 2, the resulting distribution (line 16, which represents the sum of lines 12 and 14) is more uniform than the distribution in FIG. 1 and less overall energy can be used to obtain a minimum desired energy distribution at both the top and bottom of dielectric layer.

FIG. 3 is a simplified graph depicting the distribution of electron energy within a dielectric layer according to another embodiment of the present invention. The embodiment shown in FIG. 3 employs four separate dose levels (graph lines 20, 22, 24 and 26) enabling a still further improvement in distribution uniformity (line 28, which represents the sum of lines 20, 22, 24 and 26) and a further reduction in the overall amount of energy used to obtain a minimum desired distribution throughout the entire thickness of another dielectric layer (represented by thickness Z). By selecting appropriate energy levels and doses and using the multistep electron beam treatment techniques shown in FIGS. 2 and 3, the treated dielectric layers may have similar or even improved properties as compared to a dielectric layer treated according to a single step process and have less aluminum contamination because less overall energy and/or smaller doses are required to obtain those properties.

Reference is now made to FIG. 4, which is a flow chart depicting the steps associated with a four-step treatment technique such as that shown in FIG. 3. As shown in FIG. 4, the process starts by depositing a dielectric layer over a substrate (step 30). The dielectric layer can be any appropriate type of dielectric material that will benefit from exposure to an electron beam treatment. Such benefits may be in the form of improved mechanical, physical and/or electrical properties. In some embodiments the dielectric layer is a carbon-doped silica glass or an SiOC film deposited by any of a variety of known chemical vapor deposition techniques. Also, while the dielectric layer may be used for a variety of applications, in some embodiments the layer is used as an intermetal dielectric (IMD) layer in an integrated circuit and can be deposited using either a gapfill process (e.g., when aluminum or another etchable metal is employed as the interconnect material) or a blanket process (e.g., for damascene applications where copper is employed as the interconnect material).

Examples of suitable techniques for forming a carbon-doped silica glass film include forming a plasma from a process gas comprising an oxygen-containing organosilicon compound, such as octamethylcyclotetrasiloxane (OMCTS), a carrier gas, such as helium, and another oxygen source, such as molecular oxygen; forming a plasma from a process gas comprising an oxygen-free organosilicon compound, such as trimethylsilane (TMS), a carrier gas, such as helium, and an oxygen source, such as molecular oxygen; and forming gas phase reactions at the surface of a substrate by reacting an organosiline precursor having at least one Si—C bond, such as trimethylsilane (TMS) with ozone within a subatmospheric pressure range (e.g., between 50 Torr and below about 450 Torr) and a relatively low temperature (e.g., below 250° C.).

After the dielectric layer is deposited, the layer is subjected to the multi-step electron beam treatment process according to embodiments of the invention to modify one or more of its mechanical, physical and/or electrical properties. When the dielectric layer is a carbon-doped silica glass layer, the multi-step electron beam treatment process can be used to increase the hardness of the layer, lower its dielectric constant and reduce its intrinsic stress among other properties. The first step in the electron beam treatment process is to expose the layer to a first dose of electron beam radiation at a first energy level for a first exposure period (step 32). Generally, the energy level selected for this first exposure step determines the depth of exposure and the dose and time determine the number of electrons that penetrate the layer. An appropriate energy level is selected depending on the desired depth of the how many different steps will be employed in the electron beam treatment process. Using the four-step treatment process such as that shown in FIG. 3 as an example, the energy (and to a lesser extent the dose) used in step 32 can be selected to create any of distributions 20, 22, 24 or 26.

After the completion of treatment step 32, the dielectric layer is subjected to subsequent treatment steps, each at a differing energy level, as shown by steps 34, 36 and 38, respectively. In this manner the dielectric layer is exposed to four different electron beam treatment steps using four different energy levels selected to center the treatment at four different depth levels (e.g., each of distributions 20, 22, 24 and 26). In some embodiments the energy level used in the multiple electron beam exposure steps is increased from an initial lowest value to a final highest value during the multi-step process. In other embodiments the energy level is decreased from an initial highest value to a final lowest value during the process. In some embodiments the energy level is increased or decreased at least 20% in each successive exposure step and in other embodiments it is increased/decreased at least 50% in each successive exposure step.

In still other embodiments, the energy level is increased by a multiple of the initial exposure (or decreased by a multiple of the final exposure) where the multiple is at least 0.5 in some instances and at least either 0.8 or 1.0 in other instances. For example, in one embodiment each successive exposure in a four step process may be increased as follows: n, 1.8n, 2.6n, 3.4n where n is the initial exposure energy and the multiplier is 0.8. In another example, each successive exposure in a four step process may be decreased as follows: 2.5n, 2n, 1.5n, n where n is the final exposure energy and the multiplier is 0.5.

In some embodiments of the invention, the doses used in each of the multi-step electron beam treatments are identical. For example, in one example of an embodiment of the invention in which four treatment steps are employed using energy levels of 1.5 KeV, 3 KeV, 4.5 KeV and 6 KeV, respectively, the electron dose used in each step may be 15 $\mu C/cm^2$. In some embodiments, however, the dose levels used at higher energy levels are selected to be lower than the dose levels used at lower energy levels.

A variety of different tools can be used to perform the electron beam treatment process according to the present invention. In one embodiment electron beam modification steps 32-38 shown in FIG. 4 is carried out using a electron beam exposure apparatus similar to that described in U.S. Pat. No. 6,132,814, which is hereby incorporated by reference. A simplified, cross-sectional view of such an electron beam exposure apparatus is shown in FIG. 5.

Figure 5:
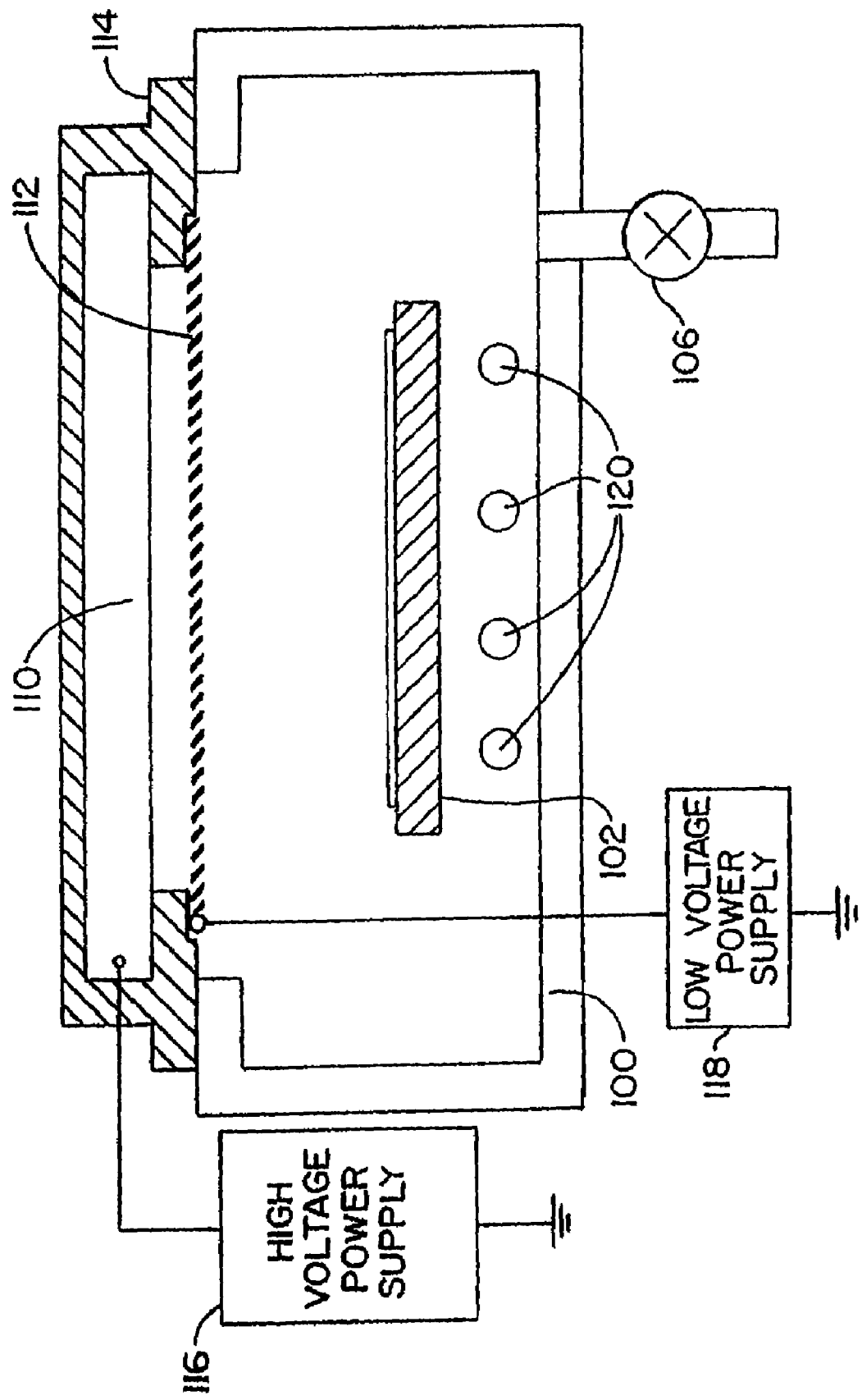
FIG. 5 is a simplified, cross-sectional view of an exemplary chamber that can be used to perform electron beam radiation curing steps discussed with respect to FIG. 4 in accordance with some embodiments of the present invention.

As shown in FIG. 5, a substrate 102 can be placed in chamber 100 and positioned underneath an electron source. The chamber can be evacuated to a pressure between, for example, 15-40 millitorr with a vacuum pump 106. The electron source can be any source that works in such a vacuum environment. In some embodiments the electron source generates a large area electron beam sufficiently wide to simultaneously expose the entire substrate. One example of a suitable electron source which generates a large uniform and stable source of electrons is described in more detail in U.S. Pat. No. 5,003,178, which is hereby incorporated by reference.

The electron source includes a cathode 110 and an anode 112 separated by an insulating member 114. The potential between these two electrodes is generated by a high voltage supply 116 applied to the cathode and a bias voltage supply 118 applied to the anode. The temperature of substrate 102 can be controlled during the electron beam treatment process by quartz lamps 120 that irradiate the bottom side of the substrate to provide heat independent of the electron beam.

Using an electron beam exposure apparatus similar to the apparatus described with respect to FIG. 5, the inventors carried out an experiment to prove that a multi-step electron beam treatment technique can be used to reduce the amount of aluminum contamination in the cured dielectric layer. In the test, identical SiOC layers were cured using a previously known single step electron beam cure treatment and a multi-step treatment according to the present invention. The single step treatment exposed the SiOC layer to ebeam of 6 kV and a dose level of 200 $\mu C/cm^2$. The multi-step treatment was a four step treatment process using the following exposure values: (1) 6 kV at 50 $\mu C/cm^2$; (2) 4.8 kV at 50 $\mu C/cm^2$; (3) 3.6 kV at 50 $\mu C/cm^2$; and (4) 2.5 kV at 50 $\mu C/cm^2$. After the cure process the layers the aluminum contamination of each layer was measured and was found to be 20 atoms/$cm^2$ in the SiOC layer exposed to the single step electron beam cure as compared to only 12 atoms/$cm^2$ in the SiOC layer exposed to the multi-step electron beam cure. This difference represents a reduction of 40 percent in the aluminum contamination.

The description above has been given to help illustrate the principles of this invention. It is not intended to limit the scope of this invention in any way. A large variety of variants are apparent, which are encompassed within the scope of this invention. For example, based on the above description, a person of skill in the art will appreciate that embodiments of the invention are not limited to just the two- and four-step treatment techniques shown in and described with respect to FIGS. 2, 3 and 4. Instead, a skilled artisan will realize that an almost endless variety of multi-step techniques can be devised including three-step techniques, techniques that employ more than four discrete steps and techniques that continuously vary the energy level from either a high to a low value or from a low to a high value. All such multistep techniques are included within the scope of the present invention. Also, while the invention has been described in detail and with reference to specific examples thereof, it will be apparent to one skilled in the art that various changes and modifications can be made therein without departing from the spirit and scope thereof. These equivalents and alternatives are intended to be included within the scope of the present invention.

What is claimed is:

1. A method of modifying a mechanical, physical and/or electrical property of a dielectric layer, the method comprising:
   exposing the dielectric layer to a first dose of electron beam radiation at a first energy level; and
   thereafter, exposing the dielectric layer to a second dose of electron beam radiation at a second energy level that is different from the first energy level, wherein the first dose of electron beam radiation is different from the second dose of electron beam radiation, and the first and second doses and the first and second energy levels combine to improve uniformity of electron energy distributed throughout the dielectric layer as compared to an exposure at a single energy level.

2. The method of claim 1 wherein the electron beam radiation has a cross-sectional area sufficient to expose an entire upper surface of the dielectric layer simultaneously to the electron beam.

3. The method of claim 1 wherein the electron beam radiation has a cross-sectional area sufficient to expose an entire upper surface of the dielectric layer simultaneously to the electron beam and the first energy level is at least 50% higher than the second energy level.

4. The method of claim 1 wherein the electron beam radiation has a cross-sectional area sufficient to expose an entire upper surface of the dielectric layer simultaneously to the electron beam and the second energy level is at least 50% higher than the first energy level.

5. The method of claim 1 wherein the second energy level is at least 20% higher or at least 20% lower than the first energy level.

6. A method of forming a dielectric layer on a substrate, the method comprising:
   depositing the dielectric layer using a chemical vapor deposition technique;
   exposing the dielectric layer to a first dose of electron beam radiation at a first energy level; and
   thereafter, exposing the dielectric layer to a second dose of electron beam radiation at a second energy level that is different from the first energy level, wherein the first dose of electron beam radiation is different from the second dose of electron beam radiation, and the first and second doses and the first and second energy levels combine to improve uniformity of electron energy distributed throughout the dielectric layer as compared to an exposure at a single energy level.

7. The method of claim 6 wherein the second energy level is at least 20% higher or at least 20% lower than the first energy level.

8. A method of forming a carbon-doped silica glass layer on a substrate, the method comprising:
   depositing the carbon-doped silica glass layer using a chemical vapor deposition technique;
   exposing the carbon-doped silica glass layer to a first dose of electron beam radiation at a first energy level; and
   thereafter, exposing the carbon-doped silica glass layer to a second dose of electron beam radiation at a second energy level that is different from the first energy level, wherein the first dose of electron beam radiation is different from the second dose of electron beam radiation, and the first and second doses and the first and second energy levels combine to improve uniformity of electron energy distributed throughout the carbon-doped silica glass layer as compared to an exposure at a single energy level.

9. The method of claim 8 wherein the electron beam radiation has a cross-sectional area sufficient to expose an entire substrate by the electron beam.

10. The method of claim 9 further comprising exposing the carbon-doped silica glass layer to a third dose of electron beam radiation at a third energy level that is at least 50% higher than each of the first and second energy levels.

11. The method of claim 10 further comprising exposing the carbon-doped silica glass layer to a fourth of electron beam radiation at a fourth energy level that is at least 50% higher than each of the first, second and third energy levels.

12. The method of claim 8 wherein the second energy level is at least 20% higher or at least 20% lower than the first energy level.

* * * * *

UNITED STATES PATENT AND TRADEMARK OFFICE
CERTIFICATE OF CORRECTION

PATENT NO. : 7,588,803 B2 Page 1 of 1
APPLICATION NO. : 11/047785
DATED : September 15, 2009
INVENTOR(S) : Demos et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 889 days.

Signed and Sealed this

Twenty-first Day of September, 2010

David J. Kappos
*Director of the United States Patent and Trademark Office*